United States Patent [19]

Hayes et al.

[11] Patent Number: 4,783,641

[45] Date of Patent: Nov. 8, 1988

[54] NMR RADIO FREQUECNY FIELD COIL WITH DISTRIBUTED CURRENT

[75] Inventors: Cecil E. Hayes, Wauwatosa; Thomas K. F. Foo; William H. Perman, both of Madison, all of Wis.; Paul R. Moran, Winston-Salem, N.C.; Paul A. Bottomley, Clifton Park, N.Y.

[73] Assignee: General Electric Company, Milwaukee, Wis.

[21] Appl. No.: 84,774

[22] Filed: Aug. 13, 1987

[51] Int. Cl.4 ................... H01P 7/00; G01R 33/20
[52] U.S. Cl. ................... 333/219; 333/227; 333/245; 324/318; 324/322
[58] Field of Search .............. 333/219, 220–221, 333/227, 231, 235, 245; 324/300, 307, 309, 316, 318, 322

[56] References Cited

U.S. PATENT DOCUMENTS

| | | | |
|---|---|---|---|
| 4,638,253 | 1/1987 | Jaskolski et al. | 324/322 X |
| 4,694,255 | 9/1987 | Hayes | 324/322 |
| 4,720,680 | 1/1988 | Nishihara et al. | 333/219 X |
| 4,740,752 | 4/1988 | Arakawa et al. | 324/318 |

Primary Examiner—Marvin L. Nussbaum
Attorney, Agent, or Firm—Mark L. Mollon; Douglas E. Stoner

[57] ABSTRACT

A uniform surface current density is approximated in an RF transmitting/receiving NMR coil by employing a plurality of discrete conductors having a resonantly distributed current. Inductive and capacitive lines provide a sinusoidal current distribution with various resonant modes providing different magnetic field orientations. The distributed current reduces losses. In a second order resonant mode, decoupling of the surface coil from a transmit coil is achieved without a blocking network.

14 Claims, 2 Drawing Sheets

NMR RADIO FREQUECNY FIELD COIL WITH DISTRIBUTED CURRENT

BACKGROUND OF THE INVENTION

This invention relates to nuclear magnetic resonance (NMR) apparatus. More specifically, this invention relates to radio frequency (RF) coils useful in NMR and other applications for transmitting and/or receiving RF signals.

In the past, the NMR phenomenon has been utilized by structural chemists to study, in vitro, the molecular structure of organic molecules. Typically, NMR spectrometers utilized for this purpose were designed to accommodate relatively small samples of the substance to be studied. More recently, however, NMR has been developed into an imaging modality utilized to obtain images of anatomical features of live human subjects, for example. Such images depicting parameters associated with nuclear spins (typically hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with the tools, for the first time, to study chemical processes in a living organism. The use of NMR to produce images and spectroscopic studies of the human body has necessitated the use of specifically designed system components, such as the magnet, gradient and RF coils.

By way of background, the nuclear magnetic resonance phenomenon occurs in atomic nuclei having an odd number of protons and/or neutrons. Due to the spin of the protons and neutrons, each such nucleus exhibits a magnetic moment, such that, when a sample composed of such nuclei is placed in a static, homogeneous magnetic field, $B_o$, a greater number of nuclear-magnetic moments align with the field to produce a net macroscopic magnetization M in the direction of the field. Under the influence of the magnetic field $B_o$, the magnetic moments precess about the axis of the field at a frequency which is dependent on the strength of the applied magnetic field and on the characteristics of the nuclei. The angular precession frequency, $\omega$, also referred to as the Larmor frequency, is given by the equation $\omega = Y B$, in which Y is the gyromagnetic ratio (which is constant for each NMR isotope) and wherein B is the magnetic field ($B_o$ plus other fields) acting upon the nuclear spins. It will be thus apparent that the resonant frequency is dependent on the strength of the magnetic field in which the sample is positioned.

The orientation of magnetization M, normally directed along the magnetic field $B_o$, may be perturbed by the application of magnetic fields oscillating at or near the Larmor frequency. Typically, such magnetic fields designated $B_1$ are applied orthogonal to the direction of magnetization M by means of radio-frequency pulses through a coil connected to radio-frequency transmitting apparatus. Magnetization M rotates about the direction of the $B_1$ field. In NMR, it is typically desired to apply RF pulses of sufficient magnitude and duration to rotate magnetization M into a plane perpendicular to the direction of the $B_o$ field. This plane is commonly referred to as the transverse plane. Upon cessation of the RF excitation, the nuclear moments rotated into the transverse plane begin to realign with the $B_o$ field by a variety of physical processes. During this realignment process, the nuclear moments emit radio-frequency signals, termed the NMR signals, which are characteristic of the magnetic field and of the particular chemical environment in which the nuclei are situated. The same or a second RF coil may be used to receive the signals emitted from the nuclei.

An important type of RF coil is the surface coil. Rather than transmission, surface coils are typically used only for receiving NMR signals that have been excited by a separate RF transmitting coil, although they may be used for both transmission and reception. Since they are placed close to the subject area being imaged, surface coils receive a stronger signal from the spins of interest and are able to provide greater resolution than larger volume RF coils. They also provide better signal-to-noise ratios because they are sensitive to a smaller volume of tissue so that they receive a lower proportion of the noise emitted by the body.

A typical surface coil is comprised simply of a single turn of conductor which can take many shapes for different applications such as a circle, a square or a rectangle. The sensitive volume of a flat surface coil is approximately subtended by the coil circumference and is about one coil radius deep from the coil center. One drawback of a single turn surface coil is that its field homogeneity is less than optimum, no matter what its shape. A further disadvantage is related to the concentrated current flow (i.e., hot spots) which results in a large power dissipation due to electrical coupling with and losses in the body being imaged. A further problem relates to the coupling of the surface coil to the body coil during excitation or transmission by a separate transmit coil. This is usually prevented by special blocking or decoupling networks.

Accordingly, it is a principal object of the present invention to provide an RF surface coil for detecting NMR signals within a sensitivity volume.

It is another object of the invention to provide an RF surface coil having reduced power dissipation and signal loss from electrical interaction with the object being imaged.

It is yet another object of the invention to provide an RF coil having a distributed current flow and an improved signal-to-noise ratio.

It is still another object to prevent cross coupling of separate transmit and receive coils without special switched networks.

It is a further object to provide an RF surface coil conformable to various contours of an object to be studied.

SUMMARY OF THE INVENTION

These and other objects are achieved by an RF coil wherein a uniform surface current density is approximate by a plurality of discrete conductors, thereby reducing losses. Sinusoidal current distributions amongst the conductors at each of a plurality of resonant frequencies correspond to different $B_1$ orientations.

In one aspect of the invention, the RF surface coil circuit comprises a plurality of mutually disposed inductive line elements. A plurality of capacitive line elements join the inductive line elements. All of the elements are non-closed (i.e., do not close on themselves) in order to form an open surface. The coil circuit is adapted to provide an RF signal input/output across one of the capacitive line elements. The coil circuit is operable in at least either a first order resonant mode or a second order resonant mode to carry a spatial current distribution when excited by an RF magnetic field in the volume of selectivity or by connection to an RF power supply operating at a respective resonant frequency.

An RF coil, according to the present invention, is comprised of a plurality of discrete conductive bars which are spaced apart and define an open coil surface, and a plurality of discrete conductive rungs which are spaced apart and disposed in the open coil surface, the rungs form a first set of reactive elements and the bars form a second set of reactive elements, and the first and second sets of reactive elements are coupled together to resonate at the frequency of an NMR signal in a number of different modes, wherein the RF coil resonates in at least one mode in which it is substantially insensitive to a homogeneous excitation field of the resonant frequency which passes through the open coil surface.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
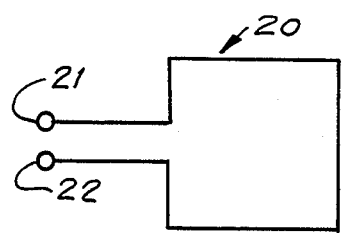
FIG. 1 is a plan view of a prior art RF surface coil.

Referring now to FIG. 1, a single turn coil 20 has a pair of input/output terminals 21 and 22 and is useful for transmitting or receiving RF energy. However, when coil 20 is used as an NMR surface coil, it is often a receive-only coil. Even if coil 20 does not transmit in NMR applications, it should be capable of producing a reasonable homogeneous RF magnetic field since this is equivalent to having a homogeneous response to excited spins in the sensitivity volume of the coil. Since all of the current is concentrated into one conductor, coil 20 is subject to losses resulting from eletrical coupling with the object subject to the RF field.

Figure 2:
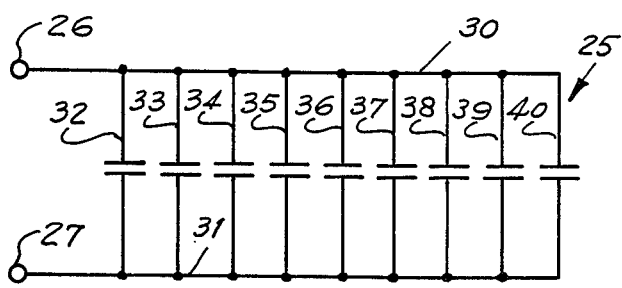
FIG. 2 is a schematic representation of an RF coil according to the invention.

FIG. 2 shows a first embodiment of the invention which corrects for the problem of high concentration of current in the prior art by employing a plurality of discrete conductors extending between a transmission line to approximate a more uniform surface current density. A coil 25 includes a pair of non-closed conductive bars 30 and 31 which form inductive transmission-line elements that are connected to a pair of input/output terminals 26 and 27. A plurality of conductive rungs 32–40 form capacitive elements which join inductive elements 30 and 31 such that capacitive elements 32–40 are all connected in parallel. Any number of capacitive elements can be used. The larger the number of capacitive elements, the better the approximation of uniform current density, although sufficient open space must be left for magnetic flux paths through the coil. The interconnected rungs 32–40 and bars 30-31 are disposed in a common coil surface. This coil surface can have many shapes to match contours of the patient, but it is characterized as being open. In other words, the coil surface does not close on itself.

When excited at one of its resonant frequencies (during either transmission or reception), coil 25 carries a current that can be modeled as a standing wave on a transmission line. Thus, viewing the coil of the present invention as a ladder, the coil current will have a sinusoidally weighted distribution between the rungs of the ladder.

Figure 3:
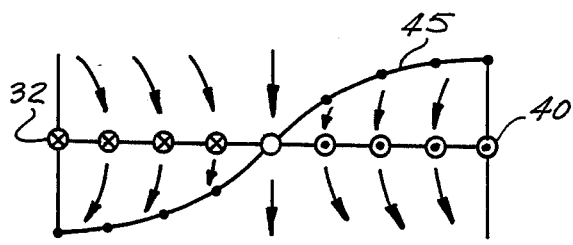
FIG. 3 is an edge-on view of the coil of FIG. 2 operating in the first order resonant mode.

FIG. 3 illustrates the operation of coil 25 at its primary resonant frequency in the first order resonant mode which corresponds to a standing wave of one-half wavelength. The circles represent capacitive rung elements 32-40 (i.e., the rungs) viewed edge-on, with dotted circles indicating current flowing up out of the figure and crossed circles indicating current flowing down into the figure at one instant of time. A curve 45 shows the standing half-wave which is approximated by the current flow in capacitive elements 32–40. The amplitude of current flow in each particular capacitive element corresponds to the instantaneous amplitude of the standing wave at that point. The arrows in FIG. 3 indicate that the $B_1$ field is substantially perpendicular to the open coil surface in the first order mode. The direction of $B_1$ alternates at the resonant frequency.

Figure 4:
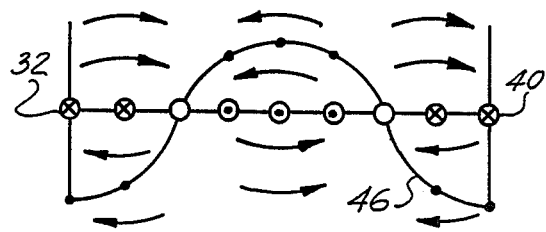
FIG. 4 is an edge-on view of the coil of FIG. 2 operating in the second order resonant mode.

FIG. 4 illustrates the second order resonant mode which occurs at a frequency that is higher than the primary resonant frequency (i.e., the standing wave 46 is a full wavelength). In this mode, the direction of $B_1$ is approximately perpendicular to its direction in the first order resonant mode.

FIGS. 3 and 4 assume equal values for the capacitances of the capacitive rung elements 32–40. However, it will be readily seen that by manipulating the values of the capacitors in the separate rungs, the relative amplitides of the currents can be tailored by relative amounts to optimize field homogeneity or for other reasons.

Figure 5:
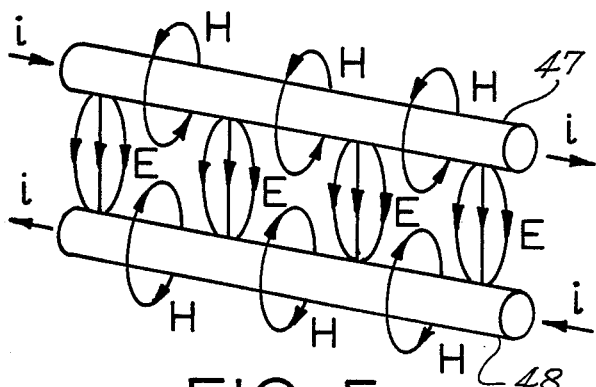
FIG. 5 is a perspective view of an infinite transmission line.
Figure 6:
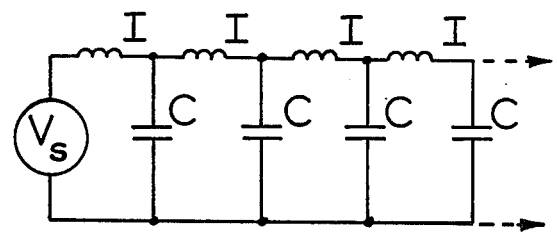
FIG. 6 is a lumped-element equivalent circuit of a transmission line.

To further illustrate the analogy to a transmission line, FIG. 5 shows a line including spaced conductors 47 and 48 each carrying a current i in opposite directions and having a voltage therebetween which varies along the length of the transmission line. The voltage and current produce an electric field E and a magnetic field H, as shown. A lumped equivalent circuit, shown in FIG. 6, includes a plurality of inductors I and capacitors C connected to a voltage source $V_s$. Truncating the circuit of FIG. 6 (i.e., forming a finite length transmission line), results in a structure analogous to an open-ended resonating tube. The truncated circuit will have as many different resonant modes as there are pairs of lumped elements in the circuit. Thus, coil 25 also has other modes of operation at higher frequencies than the primary resonant frequency, each corresponding to a different standing wavelength. The higher modes are less useful in NMR surface coil applications than the first and second modes.

Figure 7:
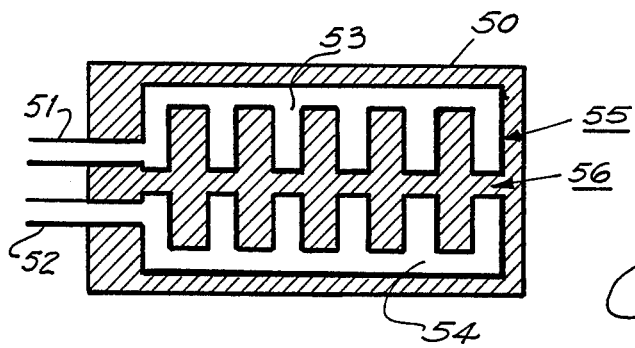
FIG. 7 is a plan view of an RF coil according to the embodiment of FIG. 2.
Figure 8:
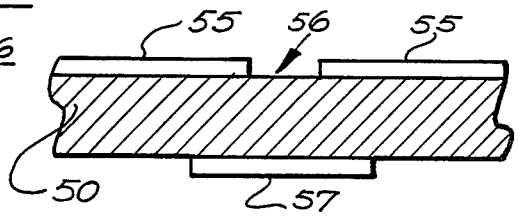
FIG. 8 is a cross section of the embodiment of FIG. 7.

A preferred embodiment for construction of coil 25 is shown in FIG. 7. A former 50 supports the coil and may be comprised of a printed circuit board material, for example. Conductive strips or foils that comprise the coil circuit are disposed on former 50. Terminal ends 51 and 52 are connected across one pair of a plurality of capacitive rung elements 55 which extend between inductive elements 53 and 54. A plurality of strips 57 bridge the gaps 56 in order to provide the required capacitance as shown in cross section in FIG. 8. Alternatively, the capacitor strips of each half of the circuit could be on opposite sides of former 50, so that they are overlapping. Preferably, the circuit is covered by an insulating material (not shown) so that it is completely encased. Rather than direct connection via terminal ends, coil 25 could be driven inductively by another coil.

Figure 9:
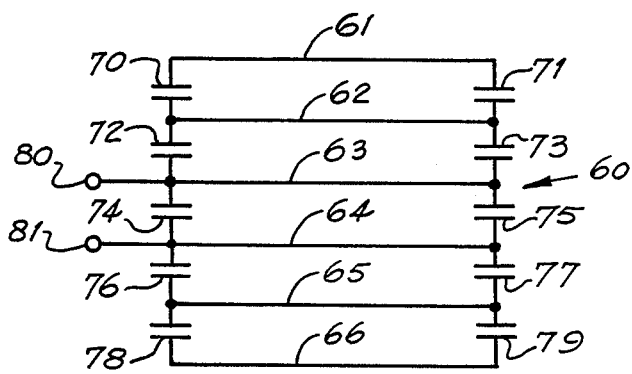
FIG. 9 is a schematic representation of another embodiment of the invention.

Referring now to the alternative embodiment of FIG. 9, a coil circuit 60 approximates a uniform surface current density by employing a plurality of inductive rung elements 61-66 connected in parallel by a plurality of capacitive bar elements 70-79. In this embodiment, capacitive elements 70-79 provide the non-closed transmission lines, and inductive elements 61-66 are the discrete conductors approximating the uniform surface current density. A pair of input/output terminals 80 and 81 are connected across one of the capacitive elements, such as center capacitive element 74 to excite the first order mode. An off/center capacitor, such as 76, would be used to excite higher order modes. Coil 60 has the same first and second order resonant modes as shown in FIGS. 3 and 4, except that the view is such that the inductive elements 60-66 are perpendicular to the plane of FIGS. 3 and 4 rather than the capacitive elements (i.e., the inductive elements are the rungs of the ladder). Furthermore, the higher order modes occur at frequencies lower than the primary mode frequency.

Figure 10:
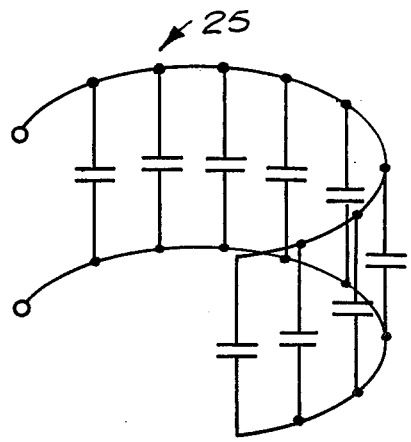
FIG. 10 is a modification of the coil circuit of FIG. 2.
Figure 11:
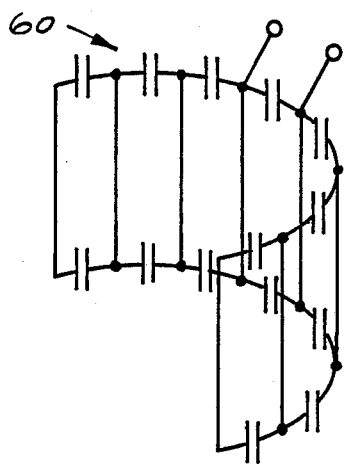
FIG. 11 is a modification of the coil circuit of FIG. 9.

The open coil surface need not be flat but can be conformed to various contours of an object being studied by NMR apparatus while retaining field homogeneity. FIGS. 10 and 11 show U-shaped coils that would be useful in studying a patient's neck. The coil circuit could be carried on a rigid U-shaped former or a former of any other desired shape. Alternatively, a flexible former and coil circuit could be employed so that the coil could be shaped to fit any desired contour.

Figure 12:
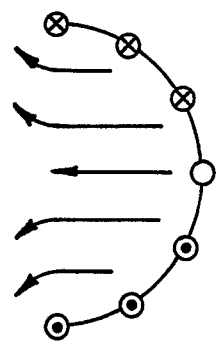
FIG. 12 shows the first order resonant mode of the coil circuits of FIGS. 10 or 11.
Figure 13:
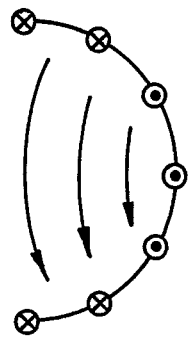
FIG. 13 shows the second order resonant mode of the coil circuits of FIGS. 10 or 11.
Figure 14:
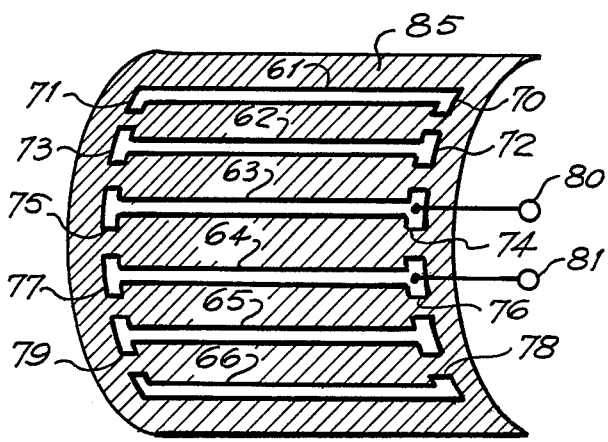
FIG. 14 is a perspective view of a preferred implementation of the embodiment of FIG. 11.

FIG. 12 shows the instantaneous direction of alternating $B_1$ of the coils of FIGS. 10 and 11 operating in the first order mode and FIG. 13 shows the second order mode. FIG. 14 shows the construction of a U-shaped surface coil employing coil circuit 60 (FIGS. 9 and 11). A U-shaped former 85 supports conductive strips that form coil circuit 60. Again, conductive strips on the opposite side of the former (not shown) complete the capacitors.

An important advantage of the present invention in its flat configuration is the ability to reduce cross-coupling between a receive-only surface coil and a separate transmit body coil. The receptivity of the RF coil of the present invention when operating in its second order resonant mode (i.e., a standing wave of one full wavelength) is substantially zero for homogeneous RF fields which pass through the open coil surface (e.g., the transmitted RF field). Thus, no blocking or decoupling network is required when NMR measurements are conducted at the second order mode resonant frequency of the surface coil.

Flat geometry surface coils having an unloaded Q in the range of about 300 to 400 have been operated in the second order resonant mode without blocking or decoupling networks to obtain high quality, low loss NMR images of the lumbar spine. In addition to the previously stated advantages, it was found that signal-to-noise ratios of the detected NMR signals were improved over single loop coils because the receptivity drops off rapidly away from the open coil surface, thus reducing the total amount of noise due to coupling with eddy currents in the object under study.

The foregoing has described an RF coil providing a substantially homogeneous $B_1$ field within its sensitivity volume while having reduced power dissipation and signal loss. The coil has a distributed current flow and is conformable to various contours of an object.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. An RF surface coil apparatus comprising:
   a plurality of mutually disposed, non-closed inductive line elements;
   a plurality of non-closed capacitive line elements joining said inductive line elements; and
   input/output means coupled across one of said capacitive line elements;
   said coil being operable in both of at least either a first order resonant mode or a second order resonant mode to carry a spatial current distribution approximating a uniform distribution having amplitudes of a standard wave.

2. The coil of claim 1 wherein said capacitive elements are electrically connected in parallel and are geometrically parallel.

3. The coil of claim 1 wherein said inductive elements are electrically connected in parallel and are geometrically parallel.

4. The coil of claim 1 wherein said inductive elements and said capacitive elements are mutually perpendicular.

5. The coil of claim 1 further comprising a former for supporting said inductive elements and said capacitive elements.

6. The coil of claim 5 wherein said former is substantially flat.

7. The coil of claim 5 wherein said former is substantially U-shaped.

8. The coil of claim 5 wherein said former is flexible, said coil being adapted to conform to curved contours.

9. The coil of claim 5 wherein said inductive elements and said capacitive elements are comprised of conductive strips disposed on said former.

10. An NMR surface coil comprising:
    a former;
    a plurality of mutually disposed, non-closed inductive line elements supported by said former;

a plurality of non-closed capacitive line elements joining said inductive line elements and supported by said former, said capacitive elements and said inductive elements being substantially perpendicular; and input/output means coupled across one of said capacitive line elements;

said surface coil being operable in both of at least either a first order mode or a second order mode to carry a substantially sinusoidal current distribution.

11. An NMR surface coil comprising:

a plurality of discrete conductive bars which are spaced apart and which define an open coil surface; and a plurality of discrete conductive rungs which are spaced apart and disposed in the open coil surface, wherein the rungs form a first set of reactive elements and the bars form a second set of reactive elements, and the first and second sets of reactive elements are interconnected to resonate in a plurality of different modes, and in one of said resonant modes the NMR surface coil is substantially insensitive to a homogeneous NMR excitation field of the same resonant frequency which passes through the open coil surface.

12. The NMR coil as recited in claim 11 in which the conductive bars are substantially parallel and the conductive rungs are substantially parallel to each other and substantially perpendicular to the conductive bars.

13. The NMR coil as recited in claim 11 in which the conductive bars form inductive reactive elements and the rungs form capacitive reactive elements.

14. The NMR coil as recited in claim 11 in which the open coil surface is shaped to conform with the subject of an NMR measurement.

* * * * *